United States Patent [19]
Lee

[11] Patent Number: 6,026,054
[45] Date of Patent: Feb. 15, 2000

[54] MEMORY DEVICE HAVING A PIPE COUNTER

[75] Inventor: Myong Don Lee, Ichon-shi, Rep. of Korea

[73] Assignee: Hyundai Electronics Industries Co., Ltd., Kyoungki-do, Rep. of Korea

[21] Appl. No.: 09/059,182

[22] Filed: Apr. 14, 1998

[30] Foreign Application Priority Data

Apr. 16, 1997 [KR] Rep. of Korea ................. 97-13975

[51] Int. Cl.[7] ........................................... G11C 8/04
[52] U.S. Cl. .................. 365/236; 365/233; 365/193; 365/226; 377/26
[58] Field of Search ........................... 365/236, 233, 365/193, 226; 377/46, 26

[56] References Cited

U.S. PATENT DOCUMENTS 5,544,120  8/1996  Kuwagata ..................... 365/222

*Primary Examiner*—Andrew Q. Tran
*Attorney, Agent, or Firm*—Gary M. Nath; Gregory B. Kang; Nath & Associates

[57] ABSTRACT

The present invention discloses a memory device having a pipe counter. It provides the advantages in that it can reduce by about 50% the number of transistors needed in constructing a pipe counter while performing the same functions as a conventional pipe counter, thereby reducing the circuit area and decreasing the driving current of the counter, by applying the concept of a ring counter to a pipe counter used in a data output terminal of DRAM.

4 Claims, 4 Drawing Sheets

MEMORY DEVICE HAVING A PIPE COUNTER

BACKGROUND OF THE INVENTION

1. Field of the Invention

The present invention relates to a memory device having a pipe counter. In particular, the present invention relates to a memory device having a pipe counter which can perform the same functions as a conventional pipe counter while reducing the circuit area and decreasing the driving current of the counter, by applying the concept of a ring counter to a pipe counter used in a data output terminal of DRAM.

2. Description of the Prior Art

Typically, counters used in the data output terminals of DRAM employ pipe counters.

A schematic diagram of a conventional pipe counter circuit is shown in FIG. 1. As shown in FIG. 1, a conventional pipe counter includes a NOR-gate NOR1 for NORing a column latency CL signal and a power signal passed through an inverter INV1 so as to output the resulting signals to pipe counter input terminals 1, 2 and 3, respectively; pipe counter input terminals 1, 2 and 3 having NAND-gates 11, 21 and 31 for NANDing the signals output from the NOR-gate NOR1, and for outputting the resulting signals through respective delay sections 12, 22 and 32 to pipe counter output sections 4, 5 and 6, respectively; and pipe counter outputs sections 4, 5 and 6 driven in response to the signals input from the respective pipe counter input terminals 1, 2 and 3, for outputting respective pipe counter signals pipe counter 0, pipe counter 1, and pipe counter 2.

In operation, a level row address signal LRAS representing a read mode and a clock are input to drive the circuit.

The pipe counter output section 4 is driven by means of a N-MOS transistor N41 which is driven in response to the signal outputted from the input terminal 1, and the respective pipe counter input terminals 1, 2 and 3 and the respective pipe counter output sections 4, 5 and 6 have the same structure.

The operation of a conventional pipe counter constructed as above will be explained below by reference to the timing diagram of FIG. 2.

When the power signal (FIG. 2A) reaches a high level and the LRAS signal (FIG. 2B) reaches a high level, both a low level (FIG. 2C) input through the CL signal terminal and a low level of the power signal passed through the inverter INV1 are inputted into the NOR-gate NOR1.

Therefore, the NOR-gate NOR1 outputs a high level, and the NAND-gate NAND11, one end of which receives the output signal from the NOR1, outputs a high level (from node 1), thereby turning on the N-MOS transistor N41 within the pipe counter output terminal 4.

Next, the node (node 2) connected to the drain terminal of the N-MOS transistor N41 reaches a low level, and the P-MOS transistor P41 connected to it is turned on. Accordingly, the level of the pipe counter 0 node (node 3) becomes a high level, thereby outputting a signal to the pipe counter output terminal in response to the clocks (FIG. 2D).

With signals other than those (for example, Cl signal : H, power signal :L), the pipe counter circuit does not work.

However, the pipe counter operating as above involves some problems in constructing the circuit so as to operate only in read mode.

In other words, the problem is that the circuit as constructed is automatically operated when the power is turned on and the LRAS signal is at a high level.

Also, as explained above, since the pipe counter is constructed using transistor delays, a plurality of transistors having a large size is required.

Also, additional control transistors for controlling the delay transistors are required.

Therefore, there is the problem that the driving current of the transistors is increased and a large layout is necessary for the large transistors.

SUMMARY OF THE INVENTION

It is an object of the present invention to solve the problems involved in the prior art, and to provide a memory device including a counter which can perform the same function as a pipe counter without using a conventional delay transistor.

In order to achieve the above object, the counter according to the present invention is designed to perform the same output as the conventional pipe counter in such a way that it makes the input data synchronized to clock inputs sequentially pass through the counter, by applying the concept of a ring counter in designing the counter.

In a memory device having a pipe counter according to the present invention, the pipe counter comprises a clock input section for logically operating an external signal and a level row address strobe (LRAS) signal to apply a clock signal to an output terminal of the pipe counter; and a reset signal input section for receiving a column latency signal and a power signal to apply the reset signal to the output terminal of the pipe counter: wherein the output of the pipe counter is consisted of first through N-th flip-flops serially connected together, the clock terminals of each of the flip-flops receives an output signal from the clock input section, the clock bar terminal of each of the flip-flops receives a signal opposite in phase to the output signal of the clock input section, the reset terminal of each of the flip-flops receives a reset signal outputted from the reset signal input section, the data input terminal of the first flip-flop receives a value which is the result of NORing the output signals of the first through (N−1)-th flip-flops, and the data input terminals of the second through N-th flip-flops receives the output signals of the first through (N−1)-th flip-flops respectively.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF PREFERRED EMBODIMENT

A preferred embodiment of the present invention will be explained in detail by reference to the accompanying drawings.

Figure 1:
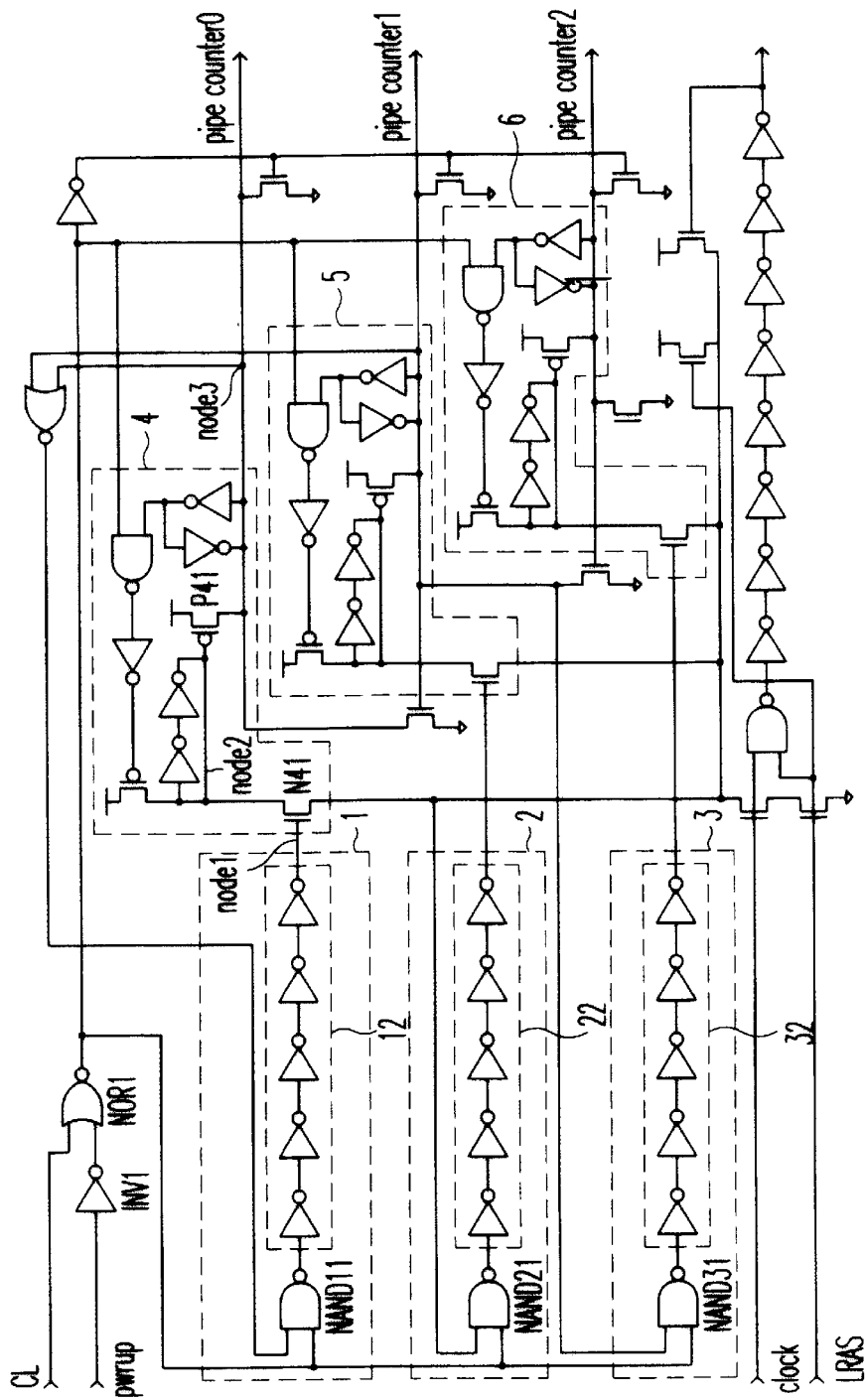
FIG. 1 shows a conventional prior art pipe counter circuit.
Figure 2:
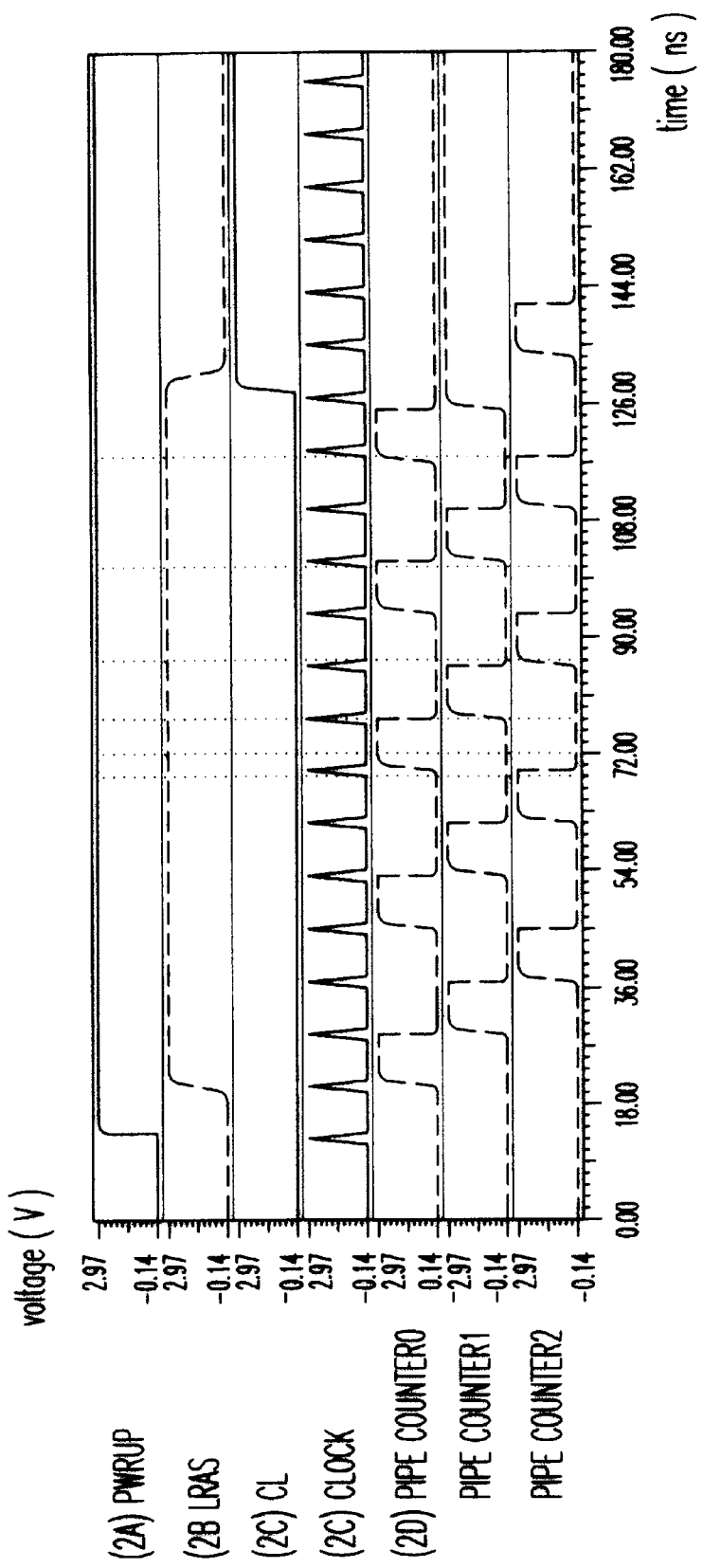
FIG. 2 is an operational timing diagram of a prior art pipe counter circuit shown in FIG. 1.
Figure 3:
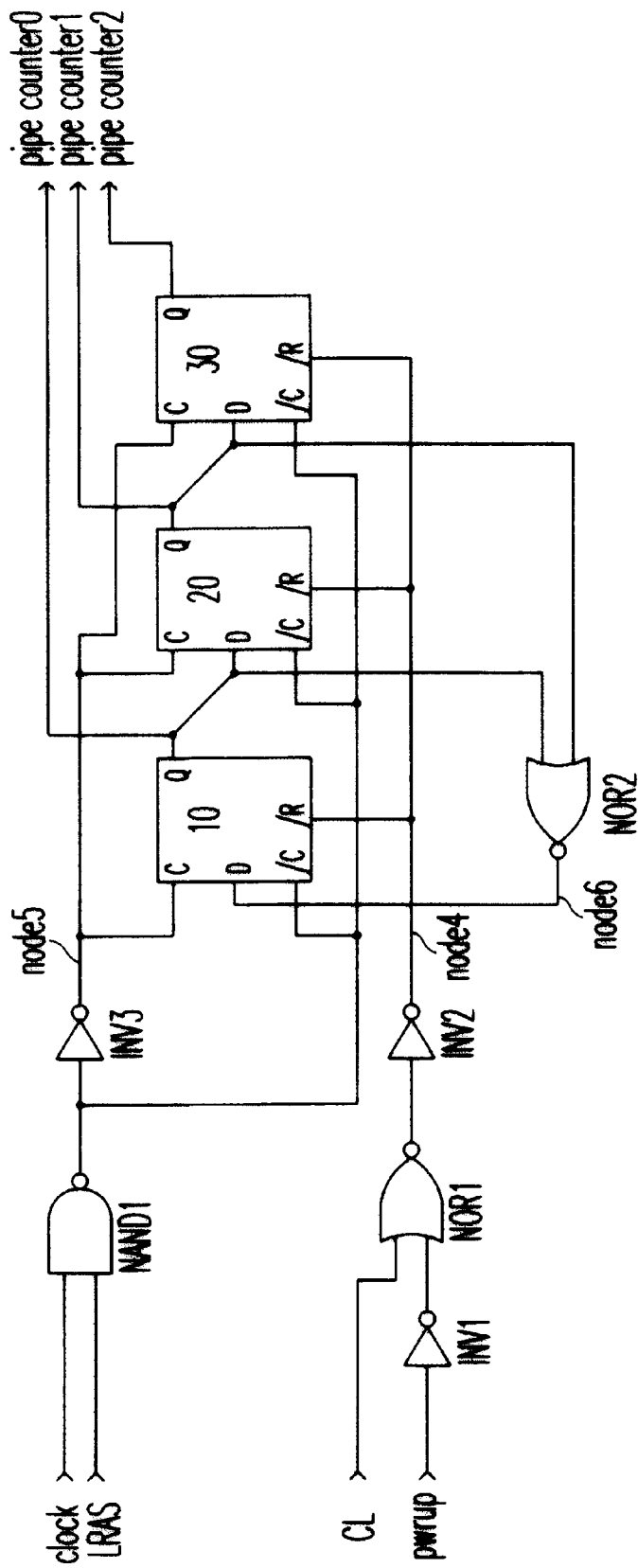
FIG. 3 shows a pipe counter circuit in accordance with the present invention.

FIG. 3 shows a pipe counter circuit incorporated into a memory device of the present invention.

As shown in the drawing, the pipe counter includes a NAND-gate NAND1 for NANDing a clock signal CLK and a LRAS signal which are applied externally; a NOR-gate NOR1 for NORing a column latency signal CL and a power signal PWRUP passed through an inverter INV1; a plurality of flip-flops 10, 20 and 30, each of the clock terminals /C, C of which receives the signal outputted from the NAND-gate NAND1 and the signal outputted from the inverter INV3, respectively, and each of the reset terminals of which receives the signal passed through an inverter INV2 which inverts the signal outputted from the NOR-gate NOR1; and an NOR-gate NOR2 for NORing the output Q of the first flip-flop 10 and the output Q of the second flip-flop 20.

Next, the input/output relationship of the first, second and third flip-flops 10, 20 and 30 will be explained.

The first flip-flop 10 receives at the data input terminal D the signal outputted from the NOR-gate NOR2 and then outputs a first pipe counter value at the output terminal Q.

The second flip-flop 20 receives at the data input terminal D the signal outputted from the first flip-flop 10 and then outputs a second pipe counter value at the output terminal Q.

The third flip-flop 30 receives at the data input terminal D the signal outputted from the second flip-flop 20 and then outputs a second pipe counter value at the output terminal Q.

The operation of the pipe counter circuit applying the concept of a ring counter according the present invention, constructed as above, will be explained below by reference to operational timing diagram FIG. 4.

When the PWRUP signal is at low level 0V and the Cl signal is at a high level 3.3V, the counter of the present invention stops all the flip-flops 10, 20 and 30 and makes the output '0V'.

Figure 4:
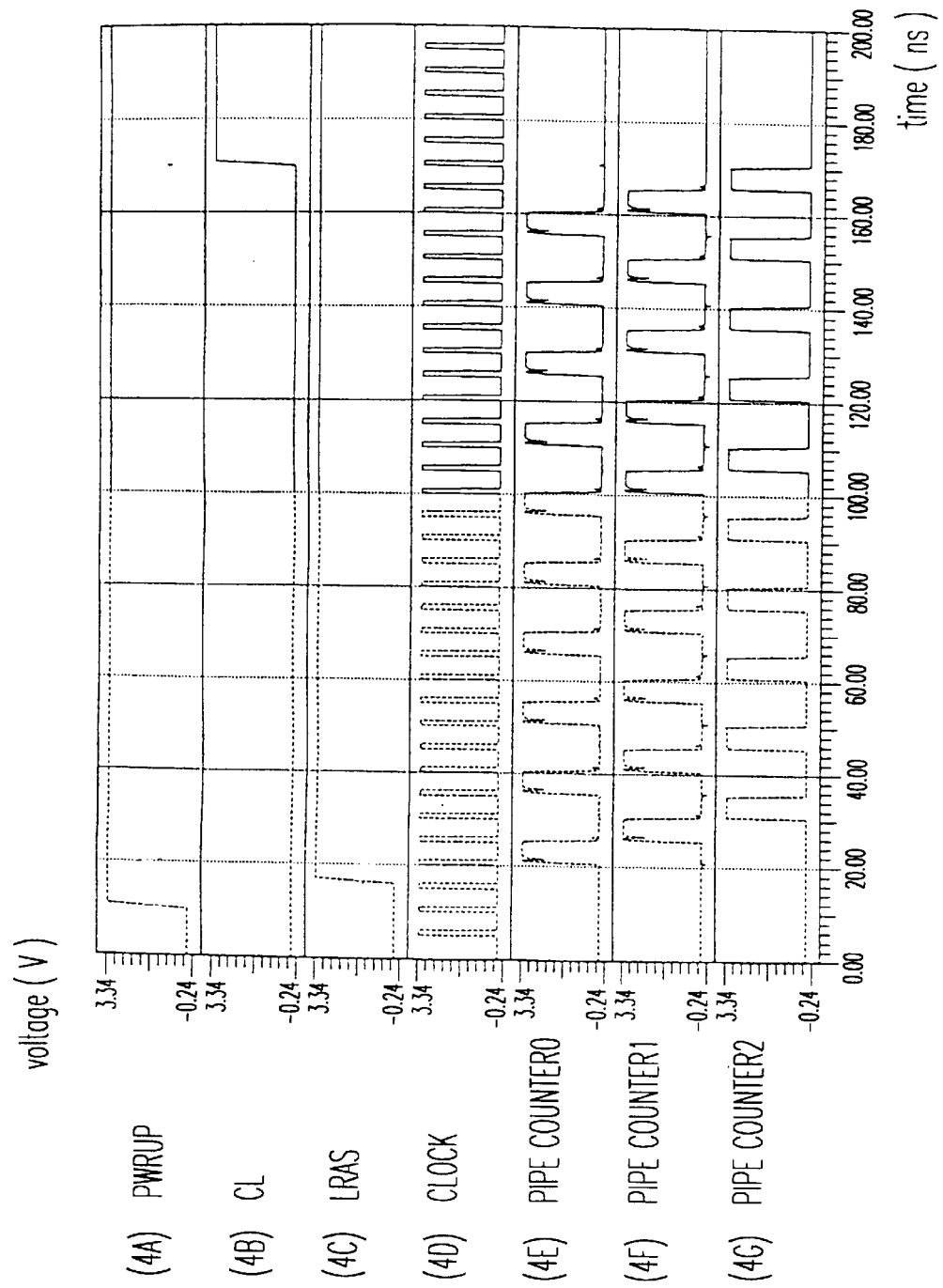
FIG. 4 is an operational timing diagram of a pipe counter circuit of the present invention shown in FIG. 3.

Conversely, if the PWRUP signal is at a high level 3.3V, the CL signal is at a low level 0V and the LRAS signal is at a high level 3.3V, all the flip-flops 10, 20 and 30 are synchronized to the inputted clocks to output waveforms such as first, second third pipe counter signals shown in FIG. 4.

A more detailed explanation follows. If the PWRUP signal is at a low level 0V, the NOR-gate NOR1 outputs unconditionally a '0' level regardless of the CL signal and then the '0' level is inverted to a '1' level through the inverter INV2 (node 4). Then, the inverted value is inputted to the reset terminals /R of each of the flip-flops 10, 20 and 30, thereby controlling the outputs of the flip-flops. That is, the outputs of the flip-flops become '0V'.

When the PWRUP signal and the CL signal are both at a high level 3.3V, the node 4 reaches a 'high' state to make each of the flip-flops 10, 20 and 30 to output 0V, respectively.

When the PWRUP signal is at a high level and the CL signal is at a low level, the output signals of the flip-flops change to 0 or 1 depending on the state of the LRAS signal. If the LRAS signal is at a low level, the voltage of the node 5 becomes 0V. As a result, all the flip-flops keep the previous stat. If the LRAS signal is at a high level, clock pulses are continuously inputted to the node 5 when the clocks are normally inputted. Since the output levels of all the flip-flops 10, 20 and 30 are initially at a low level, the value outputted (node 6) from the NOR-gate NOR2 is a high level. This value is stored at the first flip-flop 10 when the clock is at a high state but is outputted as a first pipe counter value at the moment when the clock becomes a low level. Therefore, the NOR-gate NOR2 which receives the first pipe counter value as one-side input, outputs a low level value.

Next, to the data input terminal D of the second flip-flop 20 is inputted a high level value being an output value of the first flip-flop 10. The output value of the second flip-flop 20 is stored while the clock thereof is at a high level, but if the output value of the second flip-flop 20 shifts to a low level, it is outputted as a second pipe counter value.

In addition, the output value of the second pipe counter is inputted to the data input terminal D of the third flip-flop 30. The output value of the third flip-flop 30 is stored while the clock thereof is at a high level, but if the output value of the third flip-flop 30 shifts to a low level, it is outputted as a third pipe counter value.

The operational timing diagram of the above-mentioned state is shown in FIG. 4. In FIG. 4, when the PWRUP signal (see FIG. 4(A)) is at a 'high' state, the Cl signal (see FIG. 4(B)) is at a 'low' state and the LRAS signal (see FIG. 4(C)) is at a 'high' state, respective pipe counter values (see FIG. 4(E), 4(F) and 4(G)) are outputted corresponding to the clocks (see FIG. 4(D)).

From the foregoing, the present invention provides the advantages in that it can reduce by about 50% the number of transistors needed in constructing a pipe counter and can also perform the same functions as a conventional pipe counter, thereby reducing a circuit area and decreasing the driving current of the counter, by applying the concept of a ring counter to a pipe counter used in a semiconductor memory device.

While the present invention has been described and illustrated herein with reference to the preferred embodiment thereof, it will be understood by those skilled in the art that various changes in form and details may be made therein without departing from the spirit and scope of the invention.

What is claimed is:

1. A memory device having a pipe counter, said pipe counter comprising:

a clock input section for logically combining an external signal and a level row address strobe signal to apply a clock signal to a clock terminal of the pipe counter; and a reset signal input section for receiving a latency signal and a power signal to apply a reset signal to a reset terminal of the pipe counter, wherein an output of said pipe counter is comprised of first through N-th flip-flops serially connected together, each of said flip-flops having a clock terminal, a clock bar terminal, a data input terminal, and a reset terminal, and providing an output signal, the clock terminal of each of the flip-flops receives an output signal from the clock input section, the clock bar terminal of each of the flip-flops receives a signal opposite in phase to the output signal of the clock input section, the reset terminal of each of the flip-flops receives the reset signal outputted from the reset signal input section, the data input terminal of the first flip-flop receives a value which is the result of the output signals of the first through (N–1)-th flip-flops, and the data input terminals of the second through N-th flip-flops receives the output signals of the first through (N–1)-th flip-flops respectively.

2. A memory device having a pipe counter as claimed in claim 1 wherein each of the output values of the first through N-th flip-flops are first through N-th counters' values, respectively.

3. A memory device having a pipe counter as claimed in claim 1 wherein said clock input section is an AND means for ANDing the external signal and level row address strobe signal.

4. A memory device having a pipe counter as claimed in claim 3 wherein said AND means includes a NAND means and an inverter means.

* * * * *

UNITED STATES PATENT AND TRADEMARK OFFICE
CERTIFICATE OF CORRECTION

PATENT NO. : 6,026,054
DATED : Feb. 15, 2000
INVENTOR(S) : Myong Don Lee

It is certified that error appears in the above-identified patent and that said Letters Patent is hereby corrected as shown below:

Claim 1: Column 4, 5th line from bottom of claim 1, insert --NORing-- after "result of"

Signed and Sealed this

Seventh Day of November, 2000

Attest:

Q. TODD DICKINSON

*Attesting Officer*   *Director of Patents and Trademarks*